United States Patent

Tanaka et al.

[11] Patent Number: 5,820,131
[45] Date of Patent: Oct. 13, 1998

[54] PISTON RING HAVING WEAR COATING CONSISTING OF $CR_2N$ OR A MIXTURE OF $CR_2N$ AND CR

[75] Inventors: Shoji Tanaka; Nobuyuki Yamashita, both of Shiojiri; Hiroto Fukutome, Chino, all of Japan

[73] Assignee: Teikoku Piston Ring Co., Ltd., Tokyo, Japan

[21] Appl. No.: 788,345

[22] Filed: Jan. 27, 1997

[30] Foreign Application Priority Data

Jan. 29, 1996 [JP] Japan ................................ 8-034435

[51] Int. Cl.[6] .......................................................... F16J 9/26
[52] U.S. Cl. ......................... 277/442; 277/443; 277/444; 277/477
[58] Field of Search ................................ 277/235 A, 236, 277/DIG. 6

[56] References Cited

U.S. PATENT DOCUMENTS

| 5,308,089 | 5/1994 | Ishida | 277/235 A |
| 5,582,414 | 12/1996 | Miyazaki et al. | 277/235 A |
| 5,601,293 | 2/1997 | Fukutome et al. | 277/235 A |

FOREIGN PATENT DOCUMENTS

| 4-000064 | 1/1992 | Japan | 277/235 A |
| 7-286262 | 10/1995 | Japan . | |
| 2257771 | 1/1993 | United Kingdom | 277/235 A |
| 2 276 176 | 9/1994 | United Kingdom . | |
| 2 296 257 | 6/1996 | United Kingdom . | |

*Primary Examiner*—Scott Cummings
*Attorney, Agent, or Firm*—Armstrong, Westerman, Hattori, McLeland & Naughton

[57] ABSTRACT

A $Cr_2N$ film or a mixed $Cr_2N$ and Cr film formed by physical vapor deposition on the outer circumferential surface of a piston ring which is in contact with the inner circumferential surface of a cylinder. The axial width of the outer circumferential surface of the piston ring is 0.6 mm or less. The nitrogen content of the film is 11 to 17 percent by weight. The Vicker's hardness of the film is in the range of HV1300 to HV2000. The thickness of the film is 3 μm to 30 μm.

5 Claims, 5 Drawing Sheets

PISTON RING HAVING WEAR COATING CONSISTING OF CR$_2$N OR A MIXTURE OF CR$_2$N AND CR

BACKGROUND OF THE INVENTION

1. Field of the Invention

The present invention relates to piston rings fitted on pistons used in internal combustion engines.

2. Description of the Related Art

In recent years the load to be applied to piston rings in internal combustion engines has steadily increased as a result of higher engine performance and have higher engine output. Efforts to improve oil consumption tended towards reducing the oil ring axial width to increase the function of oil control, resulting in high surface pressure occurring on the sliding surface making contact with the inner circumferential surface of the cylinder, thus making sliding conditions more severe than ever before. Also, in efforts to reduce the amount of blow-by gas, the compression ring axial width has been was reduced to improve conformability with the piston, resulting in high surface pressure on the sliding surface making contact with the inner circumferential surface of the cylinder, resulting in more severe sliding conditions than ever before. Thus, harsher demands have been imposed on the piston ring.

The chromium plating and nitriding conventionally used as surface treatments for piston rings, however, have inferior wear resistance. The CrN film proposed in Japanese Patent Laid-Open No. 7-286262 has superior wear resistance, but the adhesion is poor because of inferior toughness of the film.

SUMMARY OF THE INVENTION

This invention has the object of providing a piston ring with superior wear resistance and sufficient durability even under harsh operating conditions in the internal combustion engine.

Features of this invention are as follows: a Cr$_2$N film or a mixed Cr$_2$N and Cr film is formed by physical vapor deposition on the outer circumferential sliding surface of a piston ring. The axial width of the outer circumferential sliding surface of the piston ring is 0.6 mm or less. The nitrogen content of the film is 11 to 17 percent by weight, and the Vicker's hardness of the film is in the range of HV1300 to HV2000.

The Cr$_2$N film or mixed Cr$_2$N and Cr film of this invention has superior adhesion of the film, so that little chipping occurs in the film during coating and productivity is good, even when the axial width of the outer circumferential sliding surface of the piston ring is 0.6 mm or less.

When the nitrogen content of the film is less than 17 percent, the film toughness is good and peeling of the film does not occur during sliding movement; and when the nitrogen content is 11 percent or more, the wear resistance is good.

When the film hardness is a Vicker's hardness of HV1300 or more, the wear resistance is good. When the film hardness is within a Vicker's hardness of HV2000, the film toughness is good and peeling of the film does not occur during sliding movement.

BRIEF DESCRIPTION OF THE DRAWINGS

The aforesaid and other objects and features of the present invention will become more apparent from the following detailed description and the accompanying drawings.

DESCRIPTION OF THE PREFERRED EMBODIMENTS

Figure 1:
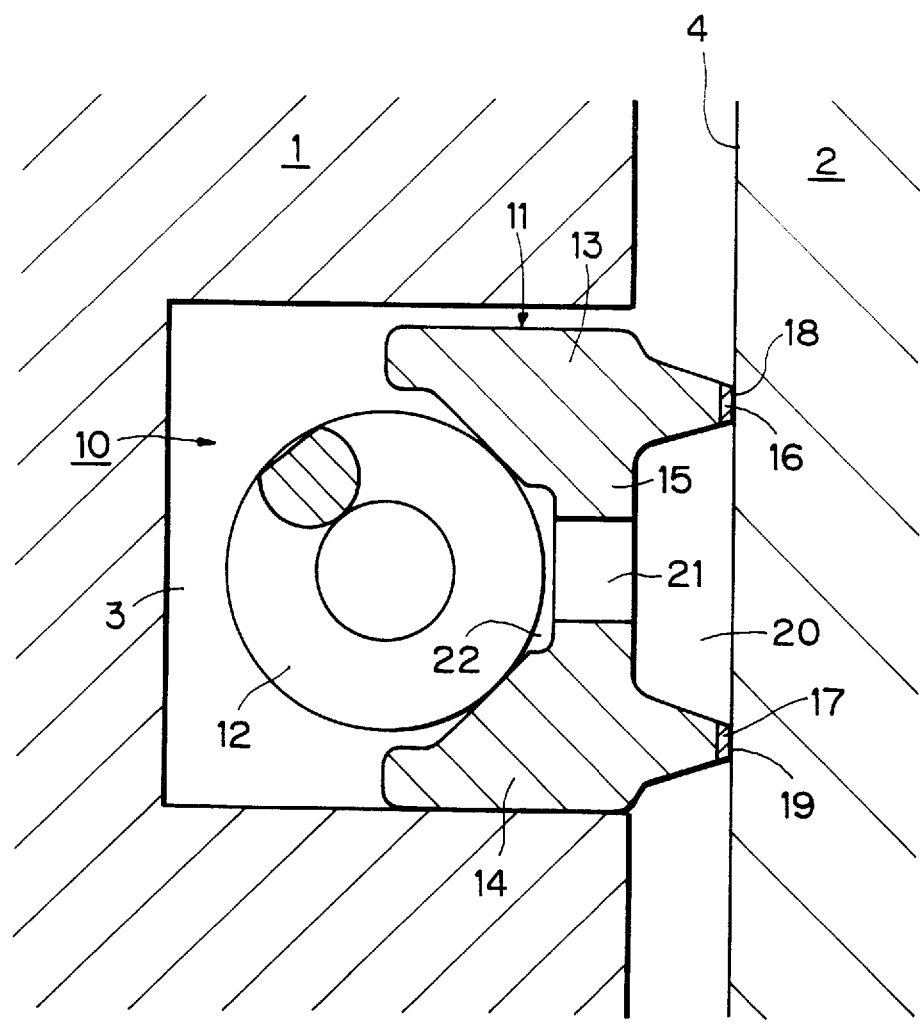
FIG. 1 is a longitudinal cross sectional view showing a combined oil ring which is fitted in an oil ring groove of the piston inserted into the cylinder in a preferred exemplary embodiment of this invention.

FIG. 1 is a longitudinal cross sectional view showing a combined oil ring which is fitted in an oil ring groove of the piston inserted into the cylinder in one preferred exemplary embodiment of this invention. Referring now to FIG. 1, a combined oil ring 10 is fitted in an oil ring groove 3 formed on the outer circumferential surface of a piston 1 inside a cylinder 2. The combined oil ring 10 is a two piece type combined oil ring made of steel, and comprises an oil ring 11 and a coil expander 12.

The oil ring 11 is a steel ring with a gap and formed in a generally I-shape in cross section, and comprises paired upper and lower rails 13 and 14 extending in the circumferential direction and joined together by a thin-walled, straight web portion 15. The outer circumferential surfaces of the upper and lower rails 13 and 14 are formed with hard films 16 and 17 by physical vapor deposition, and are in contact with the inner circumferential surface 4 of the cylinder 2 and constitute sliding surfaces 18 and 19 to scrape oil from the inner circumferential surface 4 of the cylinder 2. The axial widths of respective outer circumferential surfaces of the upper and lower rails 13 and 14 is 0.4 mm or less. The hard films 16 and 17 are Cr$_2$N films or mixed Cr$_2$N and Cr films. The nitrogen content of the films is respectively 11 to 17 percent by weight, and the Vicker's hardness of the films is respectively in the range of HV1300 to HV2000.

An outside circumferential groove 20 formed by the web portion 15 and the outside circumferential projections of the upper and lower rails 13 and 14 is an oil receiving groove. The oil on the inner circumferential surface 4 of the cylinder 2 is scraped by the sliding surfaces 18 and 19 of the upper and lower rails 13 and 14, and moves through a plurality of oil holes 21 formed on the web portion 15 at equal intervals along its circumferential direction to the inside circumferential side of the oil ring 11, and further through a plurality of oil drain holes (not shown) formed on the bottom surface 5 of the oil ring groove 3 on the piston 1 down into the oil pan.

The coil expander 12 fits in an inside circumferential groove 22 formed by the inside circumferential projections of the upper and lower rails 13 and 14 and the web portion 15. The coil expander 12 is made of a wire of a circular cross section wound into a coil, the outside cylindrical surface of the coil is then ground, and the coil is formed into a ring. Therefore, the cross section of the wire is a circle with its outside circumferential portion cut off by grinding. Here, the cross-sectional shape of the wire which forms the coil expander 12 is not limited to the one described above but may be circular etc. The coil expander 12 is provided in a compressed state with its paired ends abutting each other to exert an expanding force in the radially outward direction, and the apply pressure on the oil ring 11 in a radially outward direction, so that the sliding surfces 18 and 19 of the oil ring 11 are made to contact with the inner circumferential surface 4 of the cylinder 2.

Figure 2:
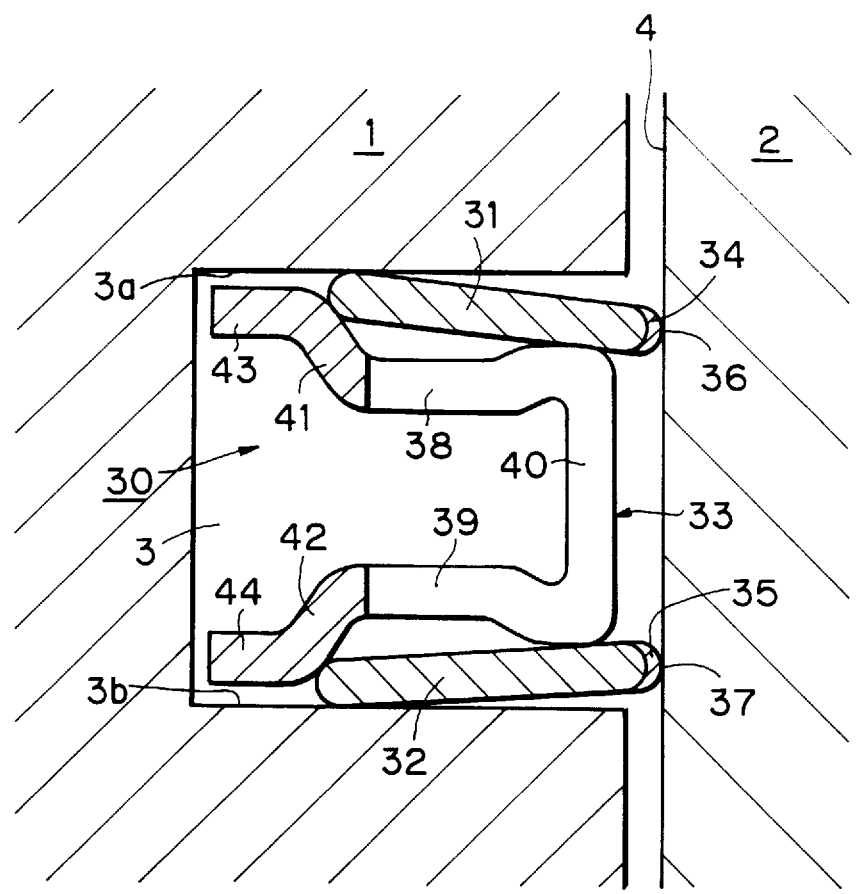
FIG. 2 is a longitudinal cross sectional view showing a combined oil ring which is fitted in an oil ring groove of the piston inserted into the cylinder in another embodiment of this invention.

FIG. 2 shows another embodiment of this invention and is different from FIG. 1 regarding the combined oil ring. A combined oil ring 30 of this embodiment is a three piece type combined oil ring made of steel, and comprised of a pair of upper and lower side rails 31 and 32 and a spacer expander 33.

The pair of side rails 31 and 32 are steel rings which are annular with a gap, and formed with a rectangular cross section. The outer circumferential surfaces of the side rails 31 and 32 are formed with hard films 34 and 35 by physical vapor deposition, and are in contact with the inner circumferential surface 4 of the cylinder 2 and form sliding surfaces 36 and 37 to scrape oil from the inner circumferential surface 4 of the cylinder 2. The axial widths of respective outer circumferential surfaces of the upper and lower side rails 31 and 32 is 0.6 mm or less. The hard films 34 and 35 are $Cr_2N$ films or mixed $Cr_2N$ and Cr films. The nitrogen content of the films is respectively 11 to 17 percent by weight, and the Vicker's hardness of the films is respectively in the range of HV1300 to HV2000.

Figure 3:
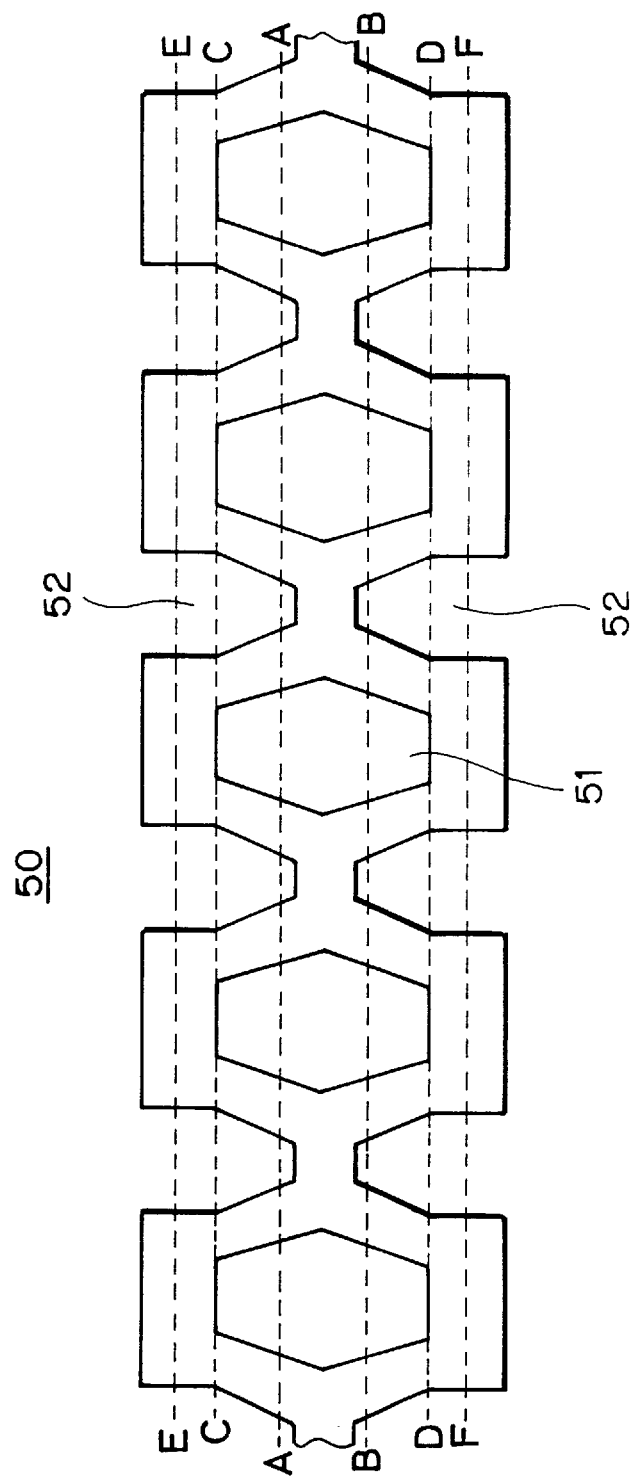
FIG. 3 is a plan view showing a portion of the material of a spacer expander.

The spacer expander 33 is formed as follows. A material 50 shown in FIG. 3 has a symmetrical shape with respect to the center axis running longitudinally. That is, a thin steel strip is provided with a plurality of tortoise shell-like holes 51, which serve as oil holes and are equally spaced in a longitudinal direction of the thin steel strip. Substantially V-shaped slits 52 are provided on both sides of the thin steel strip between the holes 51. This material 50 is bent symmetrically. In other words, the material 50 is bent along the bending lines A—A and B—B into a substantially U-shaped cross section. Next, the upper and lower end portions are bent along the bending lines C—C and D—D to stand obliquely, and then the edges of the upper and lower standing portions are bent horizontally along the bending lines E—E and F—F. After bending the material 50 as explained above, and performing the annular forming step, the cutting step and surface treatment step, the fabrication of the spacer expander 33 is complete.

This spacer expander 33 is composed of a plurality of periodic elements linked together peripherally and having a substantially U-shaped cross section. Each of these periodic elements has a pair of horizontal upper and lower portions 38 and 39, and an upright portion connecting these upper and lower portions 38 and 39. Side rail pressing portions 41 and 42 are formed respectively obliquely facing inwards radially at the inner circumference of the upper portion 38 and lower portion 39. At the inner circumference of each of the side rail pressing portions 41 and 42, are inner portions 43 and 44 extending horizontally to the inner radial direction. Oil holes are formed in the upper portion 38, the upright portion 40 and the lower portion 39.

The spacer expander 33 is provided in the oil ring groove 3 of the piston 1 in a compressed state with the paired ends abutting each other to exert an expanding force in outward radially. The pair of side rails 31 and 32 are supported separately above and below (axially) by the upper and lower portions 38 and 39. The upper and lower side rail pressing portions 41 and 42 apply pressure on the respective inner circumferential surfaces of the pair of side rails 31 and 32, so that the respective sliding surfaces 36 and 37 of the side rails 31 and 32 are made contact with the inner circumferential surface 4 of the cylinder 2, and the inner circumferential ends of the side rails 31 and 32 are made contact with the side surfaces 3a and 3b of the oil ring groove 3.

The oil on the inner circumferential surface 4 of the cylinder 2 is scraped by the sliding surfaces 36 and 37 of the upper and lower side rails 31 and 32, and moves through a plurality of oil holes formed on the spacer expander 33 to the inside circumferential side, and further through a plurality of oil drain holes (not shown) formed on the bottom surface 5 of the oil ring groove 3 on the piston 1 down into the oil pan.

Figure 4:
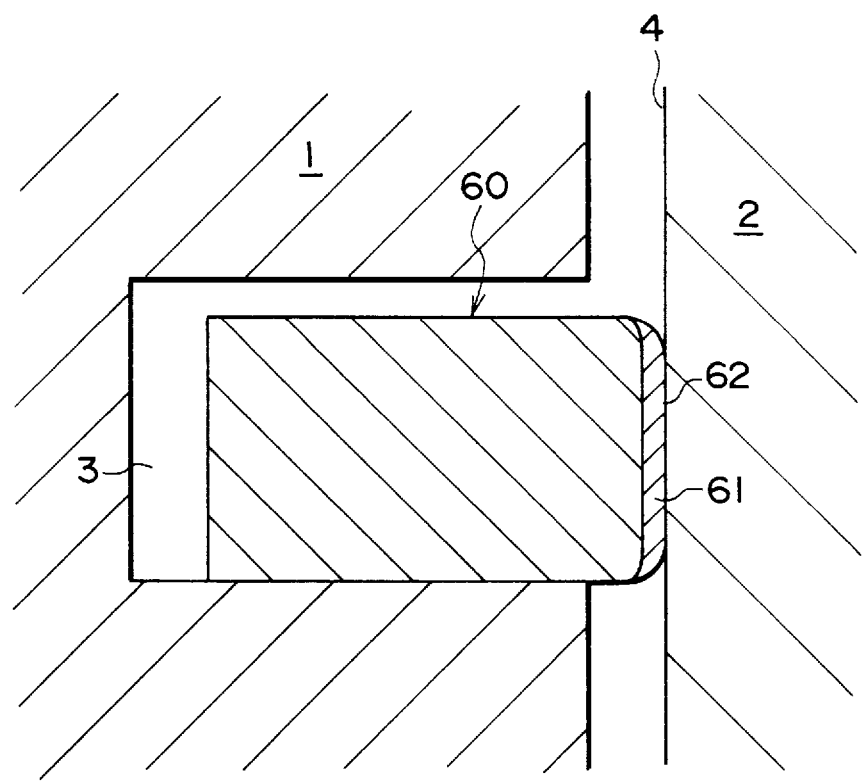
FIG. 4 is a longitudinal cross sectional view showing a compression ring which is fitted in a ring groove of the piston inserted into the cylinder in still another embodiment of this invention.

FIG. 4 shows still another embodiment of this invention. This embodiment is different from the above-mentioned two embodiments in that the piston ring is a compression ring.

A compression ring 60 is a steel ring which has a rectangular cross-sectional shape and has a barrel face. The outer circumferential surface of the compression ring 60 is formed with a hard film 61 by physical vapor deposition, and forms a sliding surface 62 which makes contact with the inner circumferential surface 4 of the cylinder 2. The axial width of the outer circumferential surface of the compression ring 60 is 0.6 mm or less. The hard film 61 is a $Cr_2N$ film or a mixed $Cr_2N$ and Cr film. The nitrogen content of the film is 11 to 17 percent by weight, and the Vicker's hardness of the film is in the range of HV1300 to HV2000.

The thickness of the hard film in the above three embodiments is preferably 3 $\mu$m to 30 $\mu$m. When the film thickness is below 3 $\mu$m, the wear resistance is inadequate and when above 30 $\mu$m, the adhesion of the film is poor.

Vacuum deposition, sputtering or ion plating can be used in physical vapor deposition in the above three embodiments.

Hereafter, the tests performed to confirm the effect of this invention are described.

Figure 5:
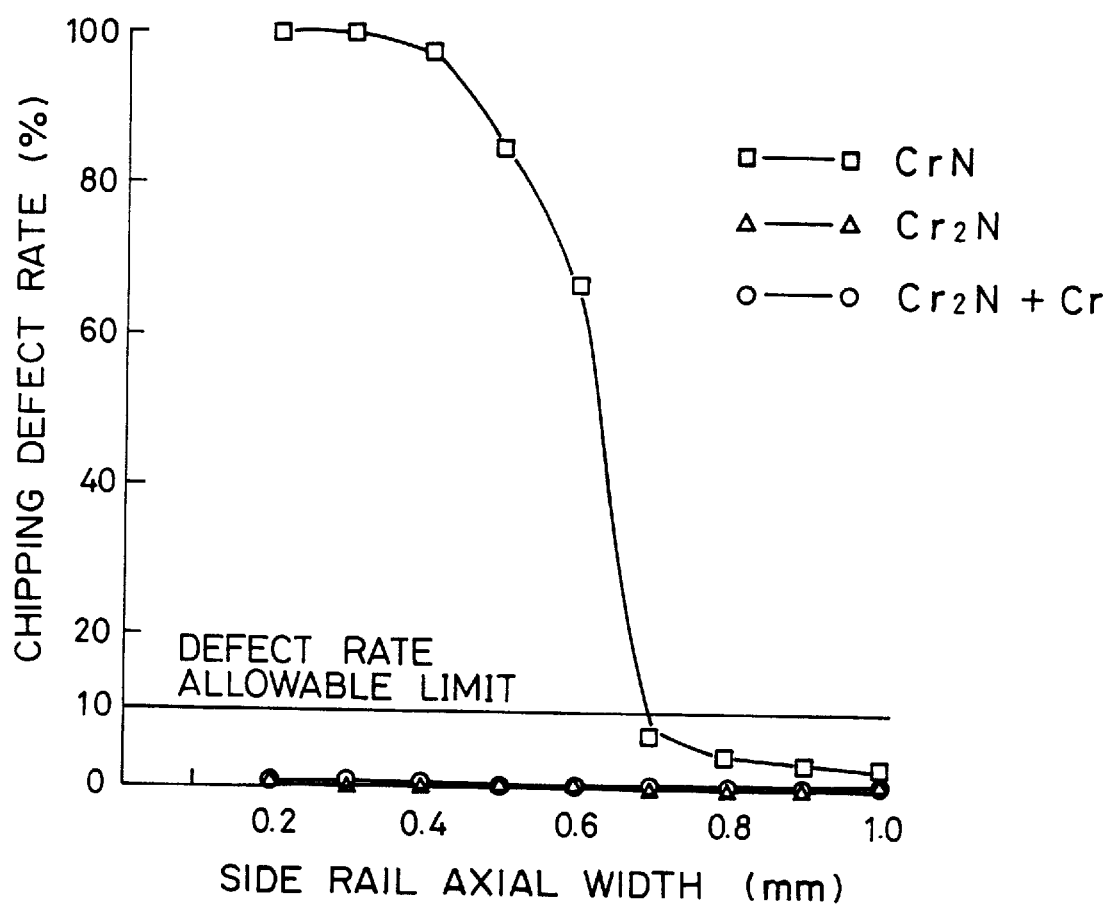
FIG. 5 is a graph showing the chipping defect rate for each film versus the axial width of the outer circumferential surface of the side rail.

FIG. 5 shows the chipping defect rate of the film when various ion plating films are formed on side rails having different axial widths using the combined oil ring of FIG. 2. The deposition conditions for those films are shown in Table 1. Side rails had a diameter of 80 mm and films were formed on 100 side rails each. An investigation of the chipping defect rate was performed by observation with a stereo microscope at 20 X magnification after forming of the ion plating film. Chipping occurred in lengths of 5 to 20 mm and mainly along the peripheral direction at the corner sections.

Results of the investigation revealed that CrN films had the chipping defect rate of more than 10 percent and had unsatisfactory productivity for side rails having an axial width of 0.6 mm or less on the outer circumferential surface. However, $Cr_2N$ films and mixed $Cr_2N$ and Cr films were found to have the chipping defect rate of less than 10 percent and have good productivity for side rails having an axial width of 0.6 mm or less on the outer circumferential surface. These results therefore show that CrN films are not suitable for side rails having an axial width of 0.6 mm or less on the outer circumferential surface, however $Cr_2N$ films or mixed $Cr_2N$ and Cr films are suitable for side rails having an axial width of 0.6 mm or less on the outer circumferential surface.

TABLE 1

| No. | Evaporating source | Bias voltage V | Pressure in chamber mTorr | Film hardness HV | Crystal structure (Note 1) | Nitrogen content wt % |
|---|---|---|---|---|---|---|
| Comparative Example 1 | Cr | 40 | 10 | 1520 | CrN | 22 |
| Embodiment 1 | Cr | 25 | 1.3 | 1400 | $Cr_2N$ | 17 |
| Embodiment 2 | Cr | 35 | 0.7 | 1510 | $Cr_2N$ + Cr | 11 |

Note 1: Determined by X-ray diffraction analysis data
Note 2: All film thicknesses were 20 μm.

Table 2 shows deposition conditions and film characteristics when ion plating films were formed on the outer circumferential surfaces (axial width: 0.2 mm) of the upper and lower rails of the combined oil rings shown in FIG. 1. Table 3 shows oil consumption after 50 and 400 hours of engine operation and results of observation at 100 X magnification with a metal microscope of the status of the rail sliding surface after completion of endurance test when the endurance test was performed at 400 hours of engine operation under full load conditions using a four cylinder diesel engine with cylinder bores (diameter: 91 mm) having pistons fitted with the combined oil rings.

The information in Table 3 reveals the following items. In gas nitriding and chromium plating, the amount of wear increases and oil consumption becomes worse. In a $Cr_2N$ film having a nitrogen content of 18 percent by weight, the film toughness is low, so peeling occurs during sliding movement and oil consumption is bad, however when a $Cr_2N$ film has a nitrogen content of 17 percent by weight, no peeling occurs and oil consumption is good. In a mixed $Cr_2N$ and Cr film having a nitrogen content of 10 percent by weight, the amount of wear is large and oil consumption is bad, however when a mixed $Cr_2N$ and Cr film has a nitrogen content of 11 percent by weight, the amount of wear is small and oil consumption is good.

In contrast to a film having a Vicker's hardness of HV1280 with large amounts of wear and bad oil consumption; a film having a Vicker's hardness of HV1300 has little wear and good oil consumption. Also, in contrast to a film having a Vicker's hardness of HV2040 with poor oil consumption due to the peeling caused as a result of a drop in film toughness, a film having a Vicker's hardness of HV2000 has no peeling and oil consumption is good.

TABLE 2

| No. | Evaporating source | Bias voltage V | Pressure in chamber mTorr | Film hardness HV | Crystal structure (Note 1) | Nitrogen content wt % |
|---|---|---|---|---|---|---|
| Comparative Example 1 | — | — | — | 1100 | gas nitriding | — |
| Comparative Example 2 | — | — | — | 900 | chromium plating | — |
| Comparative Example 3 | Cr | 50 | 1.2 | 2040 | $Cr_2N$ | 16 |
| Comparative Example 4 | Cr | 3 | 0.8 | 1280 | $Cr_2N$ | 12 |
| Comparative Example 5 | Cr | 15 | 1.7 | 1650 | $Cr_2N$ | 18 |
| Comparative Example 6 | Cr | 20 | 0.4 | 1300 | $Cr_2N$ + Cr | 10 |
| Embodiment 1 | Cr | 25 | 0.6 | 1300 | $Cr_2N$ + Cr | 11 |
| Embodiment 2 | Cr | 30 | 1.0 | 1780 | $Cr_2N$ | 15 |
| Embodiment 3 | Cr | 40 | 1.5 | 2000 | $Cr_2N$ | 17 |

Note 1: Determined by X-ray diffraction analysis data
Note 2: All film thicknesses were 20 μm.

TABLE 3

| | No. | Oil consumption after 50 hours of operation g/Hr | Oil consumption after 400 hours of operation g/Hr | Status of rail sliding surface after endurance tests |
|---|---|---|---|---|
| Comparative Example | 1 | 39 | 71 | No peeling |
| | 2 | 42 | 85 | No peeling |
| | 3 | 30 | 68 | Peeling occurs |
| | 4 | 34 | 62 | No peeling |
| | 5 | 32 | 65 | Peeling occurs |
| | 6 | 35 | 58 | No peeling |
| Embodiment | 1 | 26 | 28 | No peeling |
| | 2 | 23 | 26 | No peeling |
| | 3 | 20 | 22 | No peeling |

Note 1: Upper allowable limit of oil consumption is 50 g/Hr.

Although the present invention has been described with reference to the preferred embodiments, it is apparent that the present invention is not limited to the aforesaid preferred embodiments, but various modification can be attained without departing from its scope.

What is claimed is:

1. A piston ring comprising a film formed by physical vapor deposition on the outer circumferential sliding surface of said piston ring,
   wherein said film is selected from the group consisting of $Cr_2N$ and a mixture of $Cr_2N$ and Cr,
   wherein the axial width of said outer circumferential sliding surface is less than or equal to 0.6 mm,
   wherein a nitrogen content of said film is 11 to 17 percent by weight, and
   wherein a Vicker's hardness of said film is in the range of HV1300 to HV2000.

2. A piston ring as claimed in claim 1, wherein said film has a thickness of 3 μm to 30 μm.

3. A piston ring as claimed in claim 1, wherein said piston ring is a combined oil ring comprising one oil ring and one coil expander, and said outer circumferential sliding surface formed with said film is the outer circumferential sliding surface of said oil ring.

4. A piston ring as claimed in claim 1,
   wherein said piston ring is a combined oil ring comprising two side rails and one space expander, and
   wherein said outer circumferential sliding surface formed with said film is the outer circumferential sliding surface of said side rail.

5. A piston ring as claimed in claim 1, wherein said piston ring is a compression ring.

* * * * *